(12) United States Patent
Nakajima

(10) Patent No.: US 6,452,775 B1
(45) Date of Patent: Sep. 17, 2002

(54) ELECTROSTATIC CHUCK AND METHOD FOR MANUFACTURING THE SAME

(75) Inventor: Shu Nakajima, Kanagawa-ken (JP)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 09/608,514

(22) Filed: Jun. 30, 2000

(30) Foreign Application Priority Data

Mar. 31, 2000 (JP) .......................................... 2000-09727

(51) Int. Cl.[7] .............................................. H02N 13/00
(52) U.S. Cl. ........................ 361/234; 279/128; 361/230; 361/233
(58) Field of Search ................................ 361/234, 230, 361/233; 279/128, 8; 438/729

(56) References Cited

U.S. PATENT DOCUMENTS 5,384,682 A * 1/1995 Watanabe et al. ........... 361/234
5,663,865 A * 9/1997 Kawada et al. .............. 361/234
5,708,557 A * 1/1998 Feigenbaum et al. ........ 361/234
5,909,354 A * 6/1999 Harada et al. ............... 361/234
5,969,934 A * 10/1999 Larsen ....................... 361/234
6,122,159 A * 9/2000 Arai et al. ................... 361/234

* cited by examiner

*Primary Examiner*—Kim Huynh
(74) *Attorney, Agent, or Firm*—Martine & Penilla, LLP

(57) ABSTRACT

An electrostatic chuck includes a metal substrate. A conductive ceramic layer is disposed above the metal substrate. A high purity barrier layer is disposed above the conductive ceramic layer. The high purity barrier layer preferably has a thickness of not more than about 200 $\mu$m and a purity of at least about 99%. Exemplary materials from which the high purity insulation layer may be formed include alumina, silicon dioxide, silicon nitride, and sapphire. A method for manufacturing an electrostatic chuck includes providing a metal substrate, forming a ceramic layer over the metal substrate, and forming a high purity barrier layer over the ceramic layer. The high purity barrier layer may be formed by plasma spray coating, chemical vapor deposition, or sputtering.

15 Claims, 5 Drawing Sheets

ELECTROSTATIC CHUCK AND METHOD FOR MANUFACTURING THE SAME

BACKGROUND OF THE INVENTION

The present invention relates to semiconductor fabrication and, more particularly, to an electrostatic chuck for use in, e.g., an etching apparatus and a method for manufacturing the electrostatic chuck.

In semiconductor manufacturing processes, etching processes, insulation film formation, and diffusion processes are repeatedly carried out. As is well known to those skilled in the art, there are two types of etching processes: wet etching and dry etching. Dry etching is typically implemented by using an inductively coupled plasma etching apparatus such as shown in FIG. 1. In the plasma etching apparatus shown in FIG. 1, reactant gas is led into chamber 11 via lead-in port 13. Semiconductor wafer W is held on chuck 12 in the chamber 11. High-frequency power is applied between chuck 12, which also serves as a lower electrode, and upper electrode 14 to generate plasma in chamber 11. Semiconductor wafer W itself or an insulation film or the like formed on the wafer is etched because of the chemical reaction caused by the radicals in the plasma or the accelerated ions.

In recent years, the use of electrostatic chucks has increased because these chucks exhibit excellent characteristics in a vacuum. Electrostatic chucks generate electrostatic absorbability between a sorbate and the chuck and thereby cause the chuck to absorb the sorbate. Electrostatic absorbability consists of two forces, namely, a coulombic force and a Johnsen-Rahbek force. FIG. 2 shows a monopolar type electrostatic chuck in which only positive electrode 22 is formed in dielectric material 21 and the apparatus and the plasma potential have a negative polarity. FIG. 3 shows a bipolar type electrostatic electrode in which two electrodes, namely, positive electrode 32 and negative electrode 33, are formed in dielectric material 31.

FIG. 4 shows an electrostatic chuck in which a ceramic layer is used as the dielectric material. As shown in FIG. 4, ceramic layer 53 is adhered on disk-shaped metal substrate 51 by an adhesive layer 52. High-melting point electrode 54 is embedded in ceramic layer 53. To increase the electrostatic absorbability, electrode 54 is embedded in ceramic layer 53 close to the surface thereof. Specifically, assuming that the thickness of ceramic layer 53 is, e.g., 1 mm, electrode 54 is embedded in the ceramic layer 53 at a position about 0.3 mm below the top surface of the ceramic layer and about 0.7 mm above the bottom surface of the ceramic layer. Further, circumferential cooling gas groove 55 is formed in the top surface of ceramic layer 53.

Helium gas is supplied to cooling gas groove 55 through a gas-supplying hole (not shown) that extends through ceramic layer 53 and metal substrate 51. Once the helium gas fills groove 55, the helium gas flows over the entire boundary surface between ceramic layer 53 and semiconductor wafer W. The flow of helium gas through the minute gap between ceramic layer 53 and semiconductor wafer W, which gap is created by the course surface of the ceramic layer, cools the semiconductor wafer. In dry etching, the temperature of semiconductor wafer W heavily influences the etching characteristics. By cooling semiconductor wafer W down to a temperature of about 30° C. to about 60° C. with helium cooling gas, the etching characteristics are improved.

However, in addition to alumina, the ceramic layer in a conventional electrostatic chuck includes impurities such as titanium oxide, chromic oxide, magnesia, and the like to provide the desired conductivity. These impurities are problematic because they may contaminate the backside of the semiconductor wafer. Another drawback of conventional electrostatic chucks is that the de-chucking responsibility deteriorates at lower temperatures because of the residual absorbability generated by the coulombic force.

In view of the foregoing, there is a need for an electrostatic chuck that minimizes contamination of the backside of the wafer and allows for smooth de-chucking of the wafer.

SUMMARY OF THE INVENTION

Broadly speaking, the present invention provides an electrostatic chuck having a high purity barrier layer. The present invention also provides a method for manufacturing the electrostatic chuck having the high purity barrier layer.

In accordance with one aspect of the present invention, an electrostatic chuck is provided. The electrostatic chuck includes a metal substrate. A conductive ceramic layer is disposed above the metal substrate. A high purity barrier layer is disposed above the conductive ceramic layer.

The thickness of the high purity barrier layer is preferably not more than about 200 $\mu$m, and more preferably is in a range from about 20 $\mu$m to about 100 $\mu$m. The high purity barrier layer preferably has a purity of at least about 99%, and more preferably has a purity of at least about 99.99%. Exemplary materials from which the high purity barrier layer may be formed include alumina, silicon dioxide, silicon nitride, and sapphire.

In one embodiment, the conductive ceramic layer has an electric resistivity of not more than about $10^{12}$ $\Omega$cm. In one embodiment, the high purity barrier layer has an electric resistivity of not less than about $10^{12}$ $\Omega$cm. In one embodiment, the high purity barrier layer consists essentially of alumina having a purity of at least about 99.99%.

In accordance with another aspect of the present invention, a method for manufacturing an electrostatic chuck is provided. In this method, a metal substrate is provided. A ceramic layer is formed over the metal substrate. A high purity barrier layer is formed over the ceramic layer. In one embodiment, the high purity barrier layer is formed by plasma spray coating. Alternatively, the high purity barrier layer may be formed by chemical vapor deposition or sputtering.

The electrostatic chuck significantly reduces contamination of the backside of the semiconductor wafer and allows for smooth de-chucking of the wafer. When the high purity barrier layer of the present invention is used in a conventional Johnsen-Rahbek electrostatic chuck, a hybrid of the benefits of conventional Johnsen-Rahbek and coulombic electrostatic chucks is advantageously obtained in the thus-formed electrostatic chuck.

It is to be understood that the foregoing general description and the following detailed description are exemplary and explanatory only and are not restrictive of the invention, as claimed.

BRIEF DESCRIPTION OF THE DRAWINGS

The accompanying drawings, which are incorporated in and constitute part of this specification, illustrate exemplary embodiments of the invention and together with the description serve to explain the principles of the invention.

DETAILED DESCRIPTION OF THE INVENTION

Several exemplary embodiments of the invention will now be described in detail with reference to the accompanying drawings. FIGS. 1–4 are discussed above in the "Background of the Invention" section.

Figure 5:
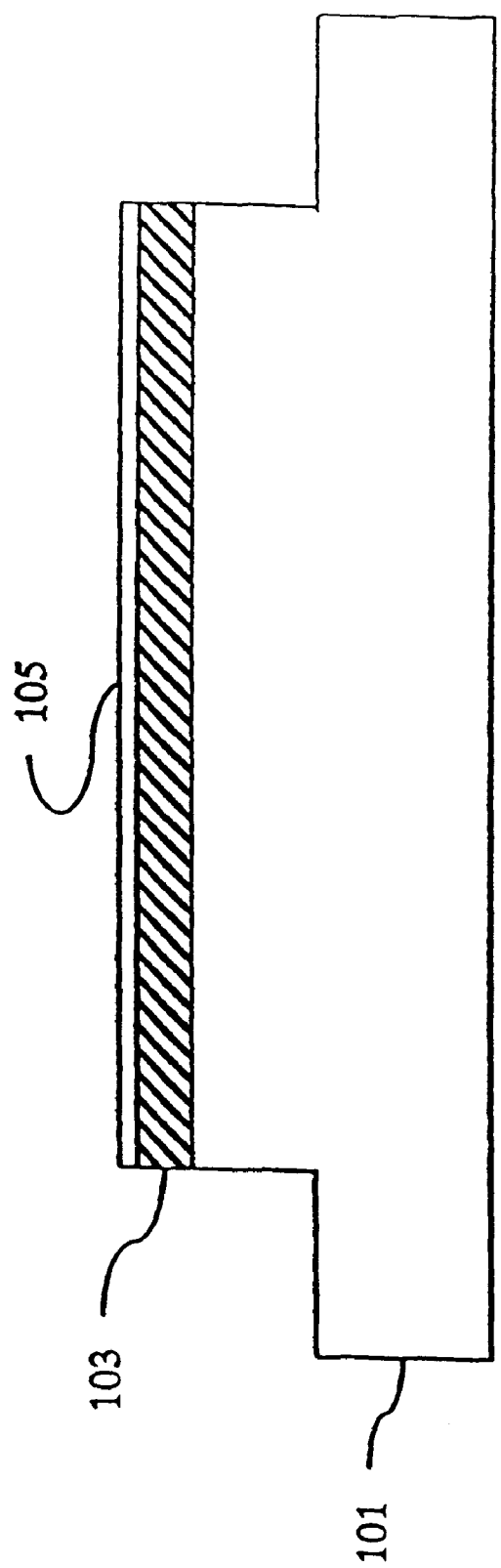
FIG. 5 is a simplified cross-sectional view of an electrostatic chuck in accordance with one embodiment of the present invention.

FIG. 5 is a simplified cross-sectional view of an electrostatic chuck in accordance with one embodiment of the invention. As shown in FIG. 5, ceramic layer 103, which has a predetermined thickness, is adhered on disk-shaped metal substrate 101 through a well-known adhesive layer (not shown). Ceramic layer 103 may be formed of any suitable ceramic material. In one embodiment, ceramic layer 103 is formed of a conductive ceramic material having an electric resistivity of not more than about $10^{12}$ Ωcm. High purity barrier layer 105 is formed over ceramic layer 103. The presence of high purity barrier layer 105 between ceramic layer 103 and the semiconductor wafer, which is a sorbate of the electrostatic chuck, significantly reduces contamination generated on the surface of the wafer.

High purity barrier layer 105 may be formed of any suitable insulative material having an electric resistivity of not less than about $10^{12}$ Ωcm, e.g., alumina ($Al_2O_3$), silicon dioxide ($SiO_2$), silicon nitride ($Si_3N_4$), and sapphire (a form of $Al_2O_3$). The insulative material from which high purity barrier layer 105 is formed preferably has a purity of at least about 99%, and more preferably a purity of at least about 99.99%. In one embodiment, high purity barrier layer 105 is a layer formed of alumina having a purity of about 99.99%.

The thickness of high purity barrier layer 105 is selected so that the layer is thin enough to provide the desired absorbability yet thick enough to have adequate mechanical strength and durability. To balance these properties, the thickness of high purity barrier layer 105 preferably does not exceed about 200 μm, and more preferably is in the range from about 20 μm to about 100 μm. In one embodiment, high purity barrier layer 105 has a thickness of about 100 μm.

High purity barrier layer 105 may be formed over ceramic layer 103 using a thermal spraying technique, e.g., plasma spray coating. Those skilled in the art are familiar with the details of thermal spraying techniques such as plasma spray coating. Other techniques that may be used to form high purity barrier layer 105 on ceramic layer 103 include chemical vapor deposition and sputtering, both of which are well known to those skilled in the art.

Figure 6:
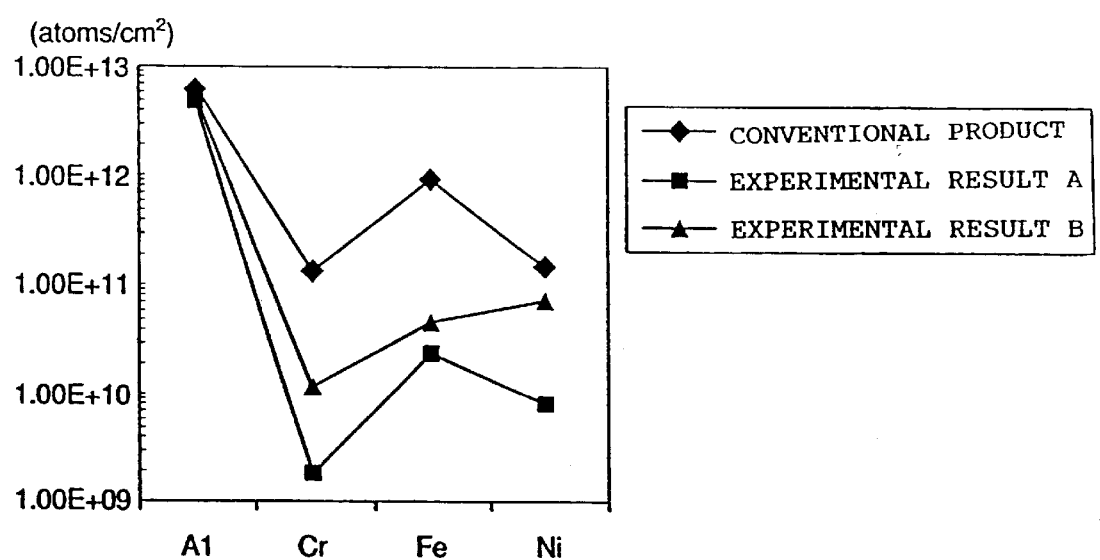
FIG. 6 is a graph that shows a comparison between the contamination level obtained when using the electrostatic chuck of the present invention and the contamination level obtained when using a prior art electrostatic chuck.

FIG. 6 is a graph that shows a comparison between the contamination level obtained when using the electrostatic chuck of the present invention and the contamination level obtained when using a prior art electrostatic chuck. The atomicity plotted with the symbol ♦ is the result obtained by measuring the atomicity per unit area (atoms/$cm^2$) of the semiconductor wafer surface when the prior art electrostatic chuck is used during an etching operation. The value plotted with the symbol ■ is the result obtained by measuring the atomicity per unit area (atoms/$cm^2$) of the semiconductor wafer surface when the electrostatic chuck of the present invention is used during an etching operation (measurement result A). The value plotted with the symbol ▲ is the result obtained by measuring the atomicity per unit area (atoms/$cm^2$) of the semiconductor wafer surface when the electrostatic chuck of the present invention is used repeatedly in a continuous etching operation (measurement result B).

Considering first the atomicity of the contaminant Cr, the atomicity (symbol ■) obtained by using the electrostatic chuck of the present invention is approximately one hundredth (1/100) of the atomicity (symbol ♦) obtained by using the prior art electrostatic chuck. In addition, the atomicity (symbol ▲) obtained by the repeated use of the electrostatic chuck is likewise not more than one tenth (1/10) of the atomicity (symbol ♦) obtained by use of the prior art electrostatic chuck.

Turning to the atomicity of the contaminant Fe, the atomicity (symbol ■) obtained by use of the electrostatic chuck of the present invention is approximately one twentieth (1/20) of the atomicity (symbol ♦) obtained by use of the prior art electrostatic chuck. Moreover, the atomicity (symbol A) obtained when repeatedly using the electrostatic chuck is also not more than one tenth (1/10) of the atomicity (symbol ♦) obtained when using the conventional electrostatic chuck.

As to the atomicity of the contaminant Ni, the atomicity (symbol ■) obtained when using the electrostatic chuck of the present invention is approximately one tenth (1/10) of the atomicity (symbol ♦) obtained by use of the prior art electrostatic chuck. Incidentally, the atomicity (symbol ▲) obtained when repeatedly using the electrostatic chuck approximates the atomicity (symbol ♦) obtained when using the conventional electrostatic chuck because a lift pin for holding the semiconductor wafer consists of a metal alloy containing Ni (50%) and Ti (50%).

The atomicity of the contaminant Al cannot be reduced because the high purity barrier layer in this example is formed of alumina, which contains Al. Of course, when the high purity barrier layer is formed of another material, e.g., $Si_3N_4$, the atomicity of the contaminant Al may be reduced.

Figure 7:
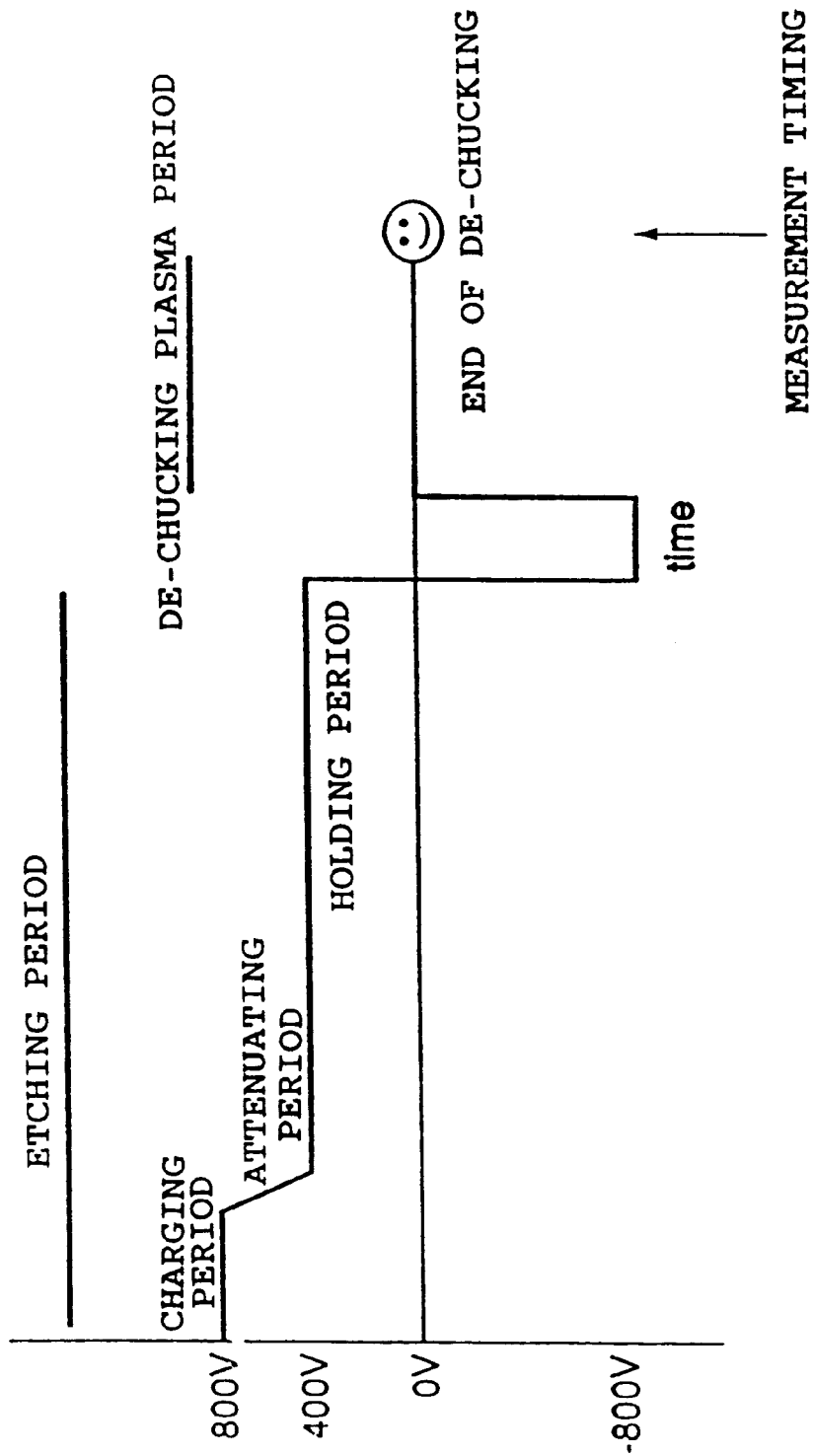
FIG. 7 is a graph showing the transition of the voltage applied to the electrostatic chuck from the beginning of etching to the end of the de-chucking process.

FIG. 7 is a graph showing the transition of the voltage applied to the electrostatic chuck from the beginning of etching to the end of the de-chucking process. At the start of etching, a relatively high voltage (800V) is applied between the semiconductor wafer and the electrostatic chuck to generate absorbability (the charging period). Once the electric charge is concentrated on the surface after the lapse of a predetermined period of time, the applied voltage is reduced to 400V (the attenuating period). While maintaining this voltage (400V), the etching operation is conducted (the holding period). The etching period includes the charging period, the attenuating period, and the holding period. When the etching period is completed, a reverse voltage (−800V) is then applied. After applying the reverse voltage for a predetermined period of time, the voltage is set to zero.

During the etching period, the semiconductor wafer is exposed to the plasma. Accordingly, the semiconductor wafer is biased by the electric charge. To release the electric charge, a weak plasma is applied for a predetermined period of time (the de-chucking plasma period). Upon completion of the de-chucking plasma period, the lift pin is moved up to terminate the de-chucking process.

At the end of the de-chucking process, helium gas having a pressure of 5 Torr is injected from the rear side of the electrostatic chuck to measure the flow rate of the helium gas leaking from the gap between the electrostatic chuck and the semiconductor wafer (measurement timing). Incidentally, the de-chucking responsibility improves as the residual absorbability becomes weak, and the residual absorbability is considered to be sufficiently eliminated when the flow rate of the helium gas is not less than 20 sccm (standard cc/min).

Table 1 shows the results obtained by measuring the flow rate of the helium gas when the time for applying the reverse voltage (−800V in this example) is varied. It is to be noted that the conditions other than the application time (any other voltage transition and voltage application time, the etching recipe, the de-chucking plasma recipe, and the ESC temperature (−20° C.)) were unchanged.

TABLE 1

| Sorbate | Application Time (sec) | Flow rate (sccm) | De-chucking responsibility |
|---|---|---|---|
| Si | 6.0 | 20.1 | Good |
| Si | 7.0 | 20.4 | Good |
| Si | 8.0 | 20.4 | Good |
| Si | 9.0 | 20.2 | Good |
| Si | 10.0 | 19.6 | Good |
| Th—SiO$_2$ | 8.0 | 20.0 | Good |
| Th—SiO$_2$ (Absorbing specular surface) | 8.0 | 19.8 | Good |

As shown in Table 1, the de-chucking responsibility can be improved irrespective of the application time of the reverse voltage. Further, regardless of whether the rear surface of the wafer is conductive Si or insulating Th-SiO$_2$, the de-chucking responsibility is improved.

Table 2 shows the results of measuring the flow rate of the helium gas when the de-chucking plasma time is varied. It is to be noted that the conditions other than the de-chucking plasma time (the voltage transition and the voltage application time, the etching recipe, the de-chucking plasma recipe, and the ESC temperature (−20° C.)) were unchanged.

TABLE 2

| De-chucking plasma time (sec) | Flow rate (sccm) | De-chucking responsibility |
|---|---|---|
| 5.0 | 20.2 | Good |
| 10.0 | 20.6 | Good |
| 15.0 | 20.8 | Good |

As shown in Table 2, the de-chucking responsibility can be improved irrespective of the de-chucking plasma time.

Table 3 shows the results of measuring the flow rate of the helium gas when the etching time is varied. It is to be noted that the conditions other than the etching time (the voltage transition and the voltage application time, the etching recipe, the de-chucking plasma recipe, and the ESC temperature (−20° C.)) were unchanged.

TABLE 3

| Etching time (sec) | Flow rate (sccm) | De-chucking responsibility |
|---|---|---|
| 1.0 | 21.6 | Good |
| 3.0 | 21.8 | Good |
| 5.0 | 20.8 | Good |

As shown in Table 3, the de-chucking responsibility can be improved irrespective of the etching time.

Table 4 shows the results of measuring the flow rate of the helium gas when the power applied to the plasma generator to generate the plasma, the power (bottom) applied to the lower electrode and the high frequency voltage ($V_{pp}$) of 13.56 MHz applied to the lower electrode are varied. It is to be noted that the conditions other than the above (the voltage transition and the voltage application time, the etching recipe, the de-chucking plasma recipe, and the ESC temperature (−20° C.)) were unchanged.

TABLE 4

| TCP (W) | Bottom (W) | Vpp (V) | Flow rate (sccm) | De-chucking responsibility |
|---|---|---|---|---|
| 1600 | 1000 | 1110 | 21.8 | Good |
| 1600 | 1500 | 1440 | 21.4 | Good |
| 1600 | 2000 | 1735 | 20.4 | Good |
| 1300 | 1000 | 1270 | 20.1 | Good |
| 1600 | 1000 | 1110 | 21.8 | Good |
| 1900 | 1000 | 1040 | 21.4 | Good |

As shown in Table 4, the de-chucking responsibility can be improved irrespective of the high frequency power applied during the etching period.

Table 5 shows the results of measuring the flow rate of the helium gas when the ESC temperature is changed. It is to be noted that the conditions other than the ESC temperature (the voltage transition and the voltage application time, the etching recipe, and the de-chucking plasma recipe) were unchanged.

TABLE 5

| ESC temperature (° C.) | Flow rate (sccm) | De-chucking responsibility |
|---|---|---|
| −20.0 | 21.8 | Good |
| 0.0 | 20.3 | Good |
| +20.0 | 20.4 | Good |

As shown in Table 5, the de-chucking responsibility can be improved irrespective of the ESC temperature.

Figure 1:
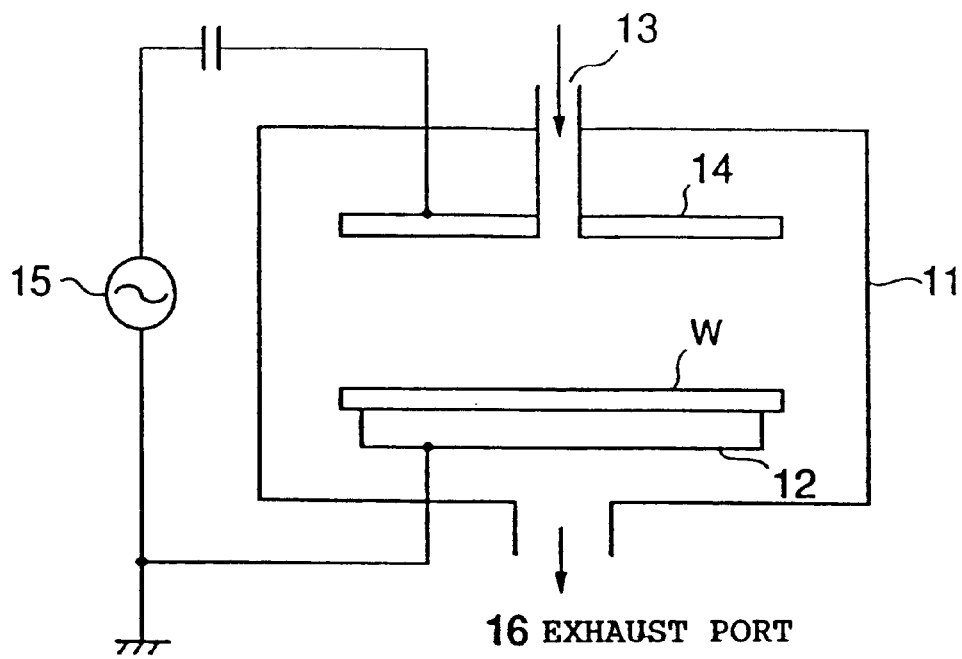
FIG. 1 is a simplified schematic cross-section showing a prior art inductively coupled plasma etching apparatus.
Figure 2:
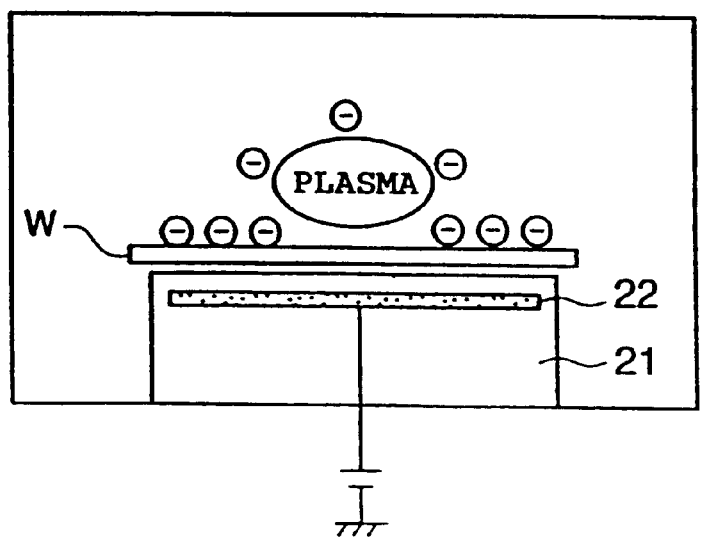
FIG. 2 is a simplified schematic cross-section showing a prior art electrostatic chuck in a plasma etching apparatus.
Figure 3:
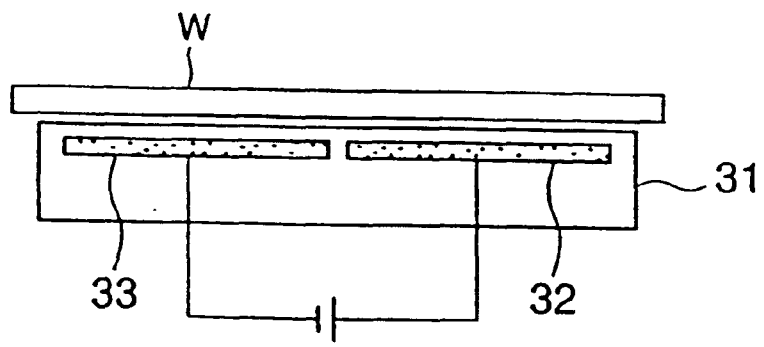
FIG. 3 is a cross-sectional view of a prior art electrostatic chuck.
Figure 4:
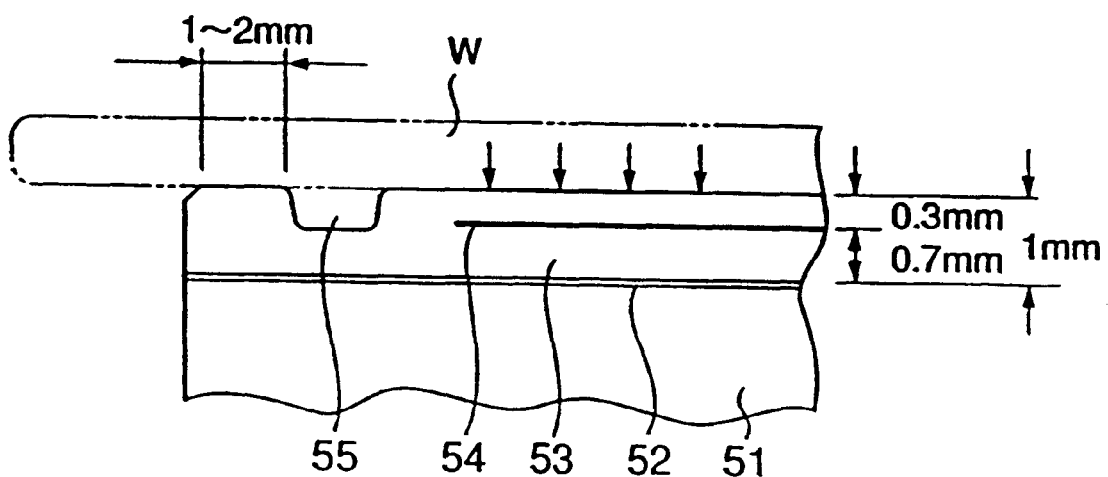
FIG. 4 is a detailed cross-sectional view of a prior art electrostatic chuck.

As demonstrated by the measurement results shown in FIG. 2 and Tables 1 to 5, the high purity barrier layer, i.e., the alumina layer in this example, on the ceramic layer significantly reduces the contamination level and improves the de-chucking responsibility. More specifically, regarding the contamination level, contaminants other than Al can be reduced to one tenth (1/10) of that in the prior art. Regarding the de-chucking responsibility, the de-chucking plasma time, which normally extends for approximately 150 seconds when the ESC temperature is −20° C., can be shortened to not more than about 10 seconds.

In comparison with conventional coulombic electrostatic chucks, the electrostatic chuck of the present invention provides a stronger coulombic chucking force by the thin dielectric layer with relatively low DC voltage. The electrostatic chuck of the present invention also may be expected to reduce device damage because there is no significant leak current from the plasma via the wafer through the electrostatic chuck. When the high purity barrier layer of the present invention is used in a conventional Johnsen-Rahbek electrostatic chuck, a hybrid of the benefits of conventional Johnsen-Rahbek and coulombic electrostatic chucks is advantageously obtained in the thus-formed electrostatic chuck.

In summary, the present invention provides an electrostatic chuck having a high purity barrier layer and a method for manufacturing the electrostatic chuck. The invention has been described herein in terms of several preferred embodiments. Other embodiments of the invention will be apparent to those skilled in the art from consideration of the specification and practice of the invention. For example, the insulative material from which the high purity barrier layer is formed is not limited to alumina. As described above, other insulative materials such as, for example, silicon dioxide, silicon nitride, and sapphire also may be used to form the high purity barrier layer. When an insulative material other than alumina is used, it may be desirable to vary the thickness and purity of the high purity barrier layer from the values set forth herein. The embodiments and preferred features described above should be considered exemplary, with the scope of the invention being defined by the appended claims and their equivalents.

I claim:

1. An electrostatic chuck, comprising:
    a metal substrate;
    a conductive ceramic layer disposed above the metal substrate; and
    a high purity barrier layer disposed above the conductive ceramic layer, the high purity barrier layer having a purity of at least 99%, having a thickness in a range from 20 $\mu$m to 200 $\mu$m, and being comprised of a material selected from the group consisting of alumina, silicon dioxide, silicon nitride, and sapphire.

2. The electrostatic chuck of claim 1, wherein the high purity barrier layer has a thickness in a range from 20 $\mu$m to 100 $\mu$m.

3. The electrostatic chuck of claim 1, wherein the high purity barrier layer has a purity of at least 99.99%.

4. The electrostatic chuck of claim 1, wherein the high purity barrier layer is comprised of alumina and has a purity of at least 99.99%.

5. The electrostatic chuck of claim 1, wherein the high purity barrier layer is comprised of a material selected from the group consisting of silicon dioxide, silicon nitride, and sapphire.

6. The electrostatic chuck of claim 1, wherein the conductive ceramic layer has an electric resistivity of not more than $10^{12}$ $\Omega$cm.

7. The electrostatic chuck of claim 1, wherein the high purity barrier layer has an electric resistivity of not less than $10^{12}$ $\Omega$cm.

8. The electrostatic chuck of claim 1, wherein the high purity barrier layer consists essentially of alumina having a purity of at least 99.99%.

9. A method for manufacturing an electrostatic chuck, comprising:
    providing a metal substrate;
    forming a ceramic layer over the metal substrate; and
    forming a high purity barrier layer over the ceramic layer, the high purity barrier layer having a purity of at least 99%, having a thickness in a range from 20 $\mu$m to 200 $\mu$m, and being comprised of a material selected from the group consisting of alumina, silicon dioxide, silicon nitride, and sapphire.

10. The method of claim 9, wherein the high purity barrier layer is formed by plasma spray coating.

11. The method of claim 9, wherein the high purity barrier layer is formed by one of chemical vapor deposition and sputtering.

12. The method of claim 9, wherein the high purity barrier layer consists essentially of alumina and has a purity of at least 99.99%.

13. An electrostatic chuck, comprising:
    a metal substrate;
    a conductive ceramic layer disposed above the metal substrate, the conductive ceramic layer having an electric resistivity of not more than about $10^{12}$ $\Omega$cm; and
    a high purity barrier layer disposed above the conductive ceramic layer, the high purity barrier layer having a thickness in a range from 20 $\mu$m to 200 $\mu$m, having an electric resistivity of not less than $10^{12}$ $\Omega$cm, and being comprised of alumina having a purity of at least 99.99%.

14. The electrostatic chuck of claim 13, wherein the high purity barrier layer has a thickness in a range from 20 $\mu$m to 100 $\mu$m.

15. The electrostatic chuck of claim 13, wherein the high purity barrier layer consists essentially of alumina having a purity of at least 99.99%.

* * * * *